(12) United States Patent
Takeuchi et al.

(10) Patent No.: US 7,732,830 B2
(45) Date of Patent: Jun. 8, 2010

(54) COMPOUND SEMICONDUCTOR LIGHT-EMITTING DIODE

(75) Inventors: Ryouichi Takeuchi, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 179 days.

(21) Appl. No.: 10/589,886

(22) PCT Filed: Mar. 14, 2005

(86) PCT No.: PCT/JP2005/004894

§ 371 (c)(1), (2), (4) Date: Aug. 18, 2006

(87) PCT Pub. No.: WO2005/088739

PCT Pub. Date: Sep. 22, 2005

(65) Prior Publication Data

US 2007/0164304 A1 Jul. 19, 2007

Related U.S. Application Data

(60) Provisional application No. 60/555,417, filed on Mar. 23, 2004.

(30) Foreign Application Priority Data

Mar. 15, 2004 (JP) .......................... 2004-073059

(51) Int. Cl.
*H01L 29/74* (2006.01)
(52) U.S. Cl. ................. 257/103; 257/E33.049
(58) Field of Classification Search .......... 257/E33.049, 257/103
See application file for complete search history.

(56) References Cited

U.S. PATENT DOCUMENTS

| 5,008,718 | A | 4/1991 | Fletcher et al. | |
|---|---|---|---|---|
| 6,346,719 | B1 * | 2/2002 | Udagawa et al. | 257/94 |
| 6,512,248 | B1 * | 1/2003 | Takeuchi et al. | 257/81 |
| 6,531,716 | B2 * | 3/2003 | Udagawa | 257/94 |
| 6,677,615 | B2 * | 1/2004 | Takeuchi et al. | 257/81 |

(Continued)

FOREIGN PATENT DOCUMENTS

JP   11-4020 A   1/1999

(Continued)

OTHER PUBLICATIONS

Y. Hosokawa, et al, "High-Power Ohmic-Electrodes Dispersive AlGaInP Double-Hetero Structure Yellowish-Green Light-Emitting Diodes", Journal of Crystal Growth, vol. 221, 2000, pp. 652-656.

(Continued)

*Primary Examiner*—Bradley K Smith
*Assistant Examiner*—Alexander Belousov
(74) *Attorney, Agent, or Firm*—Sughrue Mion, PLLC

(57) ABSTRACT

A compound semiconductor light-emitting diode comprising a light-emitting layer composed of a Group III-V compound semiconductor, and a current diffusion layer provided on the light-emitting layer and composed of a Group III-V compound semiconductor, characterized in that the current diffusion layer is composed of a conductive boron-phosphide-based semiconductor and has a bandgap at room temperature wider than that of the light-emitting layer.

7 Claims, 1 Drawing Sheet

U.S. PATENT DOCUMENTS

| | | | |
|---|---|---|---|
| 2001/0036678 A1* | 11/2001 | Udagawa | 438/22 |
| 2002/0000563 A1* | 1/2002 | Udagawa | 257/94 |
| 2003/0001162 A1* | 1/2003 | Udagawa | 257/79 |
| 2003/0027099 A1* | 2/2003 | Udagawa | 433/79 |
| 2003/0052323 A1* | 3/2003 | Takeuchi et al. | 257/81 |
| 2003/0173573 A1* | 9/2003 | Udagawa | 257/88 |
| 2003/0218180 A1* | 11/2003 | Fujiwara | 257/100 |
| 2003/0234400 A1* | 12/2003 | Udagawa | 257/80 |
| 2004/0026703 A1* | 2/2004 | Adomi et al. | 257/81 |
| 2004/0104396 A1* | 6/2004 | Nakatsu et al. | 257/85 |

FOREIGN PATENT DOCUMENTS

| | | |
|---|---|---|
| JP | 11-186601 A | 7/1999 |
| JP | 2001-144330 A | 5/2001 |
| JP | 2002-368260 A | 12/2002 |
| JP | 2003-309284 A | 10/2003 |
| JP | 2004-47760 A | 2/2004 |

OTHER PUBLICATIONS

Y. Kumasiro, et al, "Preparation and Electrical Properties of Boron and Boron Phosphide Films Obtained By Gas Source Molecular Beam Deposition", Journal of Solid State Chemistry, vol. 133, 1997, pp. 269-272.

* cited by examiner

COMPOUND SEMICONDUCTOR LIGHT-EMITTING DIODE

CROSS-REFERENCE TO RELATED APPLICATION

This application claims the benefit pursuant to 35 U.S.C. §119(e)(1) of U.S. Provisional Application, No. 60/555,417 filed Mar. 23, 2004.

TECHNICAL FIELD

The present invention relates to a compound semiconductor light-emitting diode (hereinafter may be referred to as compound semiconductor LED) having a Group III-V compound semiconductor layer serving as a light-emitting layer, wherein the LED has a current diffusion layer for diffusing LED operation current over a wide area of the light-emitting layer, leading to high emission intensity.

BACKGROUND ART

LEDs having a light-emitting layer composed of an aluminum gallium indium phosphide mixed crystal (compositional formula: $Al_XGa_YIn_ZP$: $0 \leq X, Y, Z \leq 1$, $X+Y+Z=1$) are known to emit light having a wavelength corresponding to green light to red light (see Y. Hosokawa et al., J. Crystal Growth, Vol. 221 (2000), Holland, p. 652-656).

As disclosed in aforementioned Y. Hosokawa et al., a light-emitting layer which emits visible light having a shorter wavelength is generally formed of $Al_XGa_YIn_ZP$ and exhibits a relatively large bandgap at room temperature of about 2 eV.

Generally, such a light-emitting layer has a heterojunction structure in which a cladding layer is joined to form a heterojunction for enhancing radiation recombination efficiency and attaining high-intensity light emission.

In a light-emitting layer formed of $Al_XGa_YIn_ZP$, a cladding layer serving as a barrier layer which is joined to form a heterojunction is formed of $Al_XGa_YIn_ZP$ exhibiting a bandgap wider than that of the light-emitting layer. Although a carrier-confining effect is attained, such a cladding layer is generally insufficient for diffusing a current for operating a device (i.e., device operation current) over a wide range of the light-emitting layer, since the cladding layer is formed from a semiconductor layer exhibiting a wide bandgap.

To solve this problem, one prior art technique employs a current diffusion layer on a cladding layer for spreading device operational current over a wide range of the light-emitting layer (see U.S. Pat. No. 5,008,718).

The current diffusion layer is composed of a semiconductor material exhibiting a relatively narrow bandgap (e.g., smaller than the bandgap of the light-emitting layer) in order to widely diffuse device operation current.

For example, an orange-light-emitting or red-light-emitting compound semiconductor light-emitting diode is disclosed, in which a current diffusion layer composed of aluminum gallium arsenide (compositional formula: $Al_XGa_YAs$: $0 \leq X, Y \leq 1$) is provided on the light-emitting layer composed of $Al_XGa_YIn_ZP$ (see, for example, page 4, paragraph [0010], in Japanese Patent Application Laid-Open (kokai) No. 11-4020).

However, the current diffusion layer formed of a semiconductor material exhibiting such a narrow bandgap by nature absorbs light emitted from the light-emitting layer. Therefore, even though the light-emitting layer has a heterojunction structure for attaining high-intensity light emission, high-intensity LEDs cannot be consistently and reliably produced so long as the LEDs have a conventional configuration in which a current diffusion layer is provided on the light-emitting area on the light extraction side.

Meanwhile, there has been disclosed an LED having a current diffusion layer formed of an optically transparent material such as indium tin complex oxide film (abbreviated as ITO) (see, for example, Japanese Patent Application Laid-Open (kokai) No. 2001-144330).

Transparent oxide such as ITO can be employed as a material for forming a current diffusion layer serving also as a window layer through which light is extracted to the outside, by virtue of exhibiting wide bandgap and low resistance.

However, transparent oxide generally encounters difficulty in consistently maintaining Ohmic contact with a Group III-V compound semiconductor, and diffusion of device operation current over a wide area may fail to be attained.

To overcome the above problem, aforementioned Japanese Patent Application Laid-Open (kokai) No. 2001-144330 discloses a technique for diffusing device operation current over the light-emitting layer through employment of an electrode configuration in which a plurality of Ohmic electrodes are discretely provided on a cladding layer composed of a Group III-V compound semiconductor.

However, when the Ohmic electrodes are provided discretely, cumbersome steps are required for producing LEDs or other devices, which is problematic.

The current diffusion layer included in an LED is required to be formed of an optically transparent material so as to sufficiently diffuse device operation current over a wide area of the light-emitting layer and allow light emitted from the light-emitting layer to be extracted to the outside without absorbing the emitted light. In order to satisfy the above requirements, the current diffusion layer must exhibit a bandgap at room temperature which is wider than that of the light-emitting layer.

However, when the current diffusion layer is formed from a conventionally employed $Al_XGa_YAs$ ($0 \leq X, Y \leq 1$), a conductor layer exhibiting sufficiently low resistance is difficult to form. In other words, there remains a drawback that a current diffusion layer suitably diffusing device operation current cannot be reliably formed.

Meanwhile, a Group II-VI compound semiconductor layer containing zinc (Zn) as a component element is susceptible to oxidation. In order to fabricate a light-emitting device of excellent operation reliability, such a Group II-VI semiconductor layer must be coated with an anti-oxidizing protective film. Such an additional operation would make the device production steps cumbersome.

An oxide material such as ITO, which is another material serving as a current diffusion layer, fails to reliably attain excellent Ohmic contact with a semiconductor such as a Group III-V compound semiconductor serving as a cladding layer. Thus, electric resistance between the cladding layer and the current diffusion layer formed of a transparent oxide material or a similar material increases, which may be disadvantageous in production of an LED exhibiting low forward voltage (Vf).

DISCLOSURE OF THE INVENTION

The present invention has been conceived in an attempt to solve the aforementioned problems involved in the conventional techniques. Thus, the present invention provides a compound semiconductor LED exhibiting excellent electric characteristics including forward voltage through provision of a current diffusion layer from a compound semiconductor material which can readily form a low-resistance conductor layer advantageous for causing device operation current to diffuse over the light-emitting layer; which is optically transparent; and which attains excellent Ohmic contact with a Group III-V compound semiconductor included in an LED.

Accordingly, the present invention is directed to the following.

(1) A compound semiconductor light-emitting diode comprising a light-emitting layer composed of a Group III-V compound semiconductor, and a current diffusion layer provided on the light-emitting layer and composed of a Group III-V compound semiconductor, characterized in that the current diffusion layer is composed of a conductive boron-phosphide-based semiconductor and has a bandgap at room temperature wider than that of the light-emitting layer.

(2) A compound semiconductor light-emitting diode as described in (1) above, wherein the current diffusion layer is composed of at least one species selected from among boron monophosphide, boron gallium indium phosphide represented by a compositional formula $B_\alpha Ga_\gamma In_{1-\alpha-\gamma}P$ ($0<\alpha\leq 1$, $0\leq\gamma<1$), boron nitride phosphide represented by a compositional formula $BP_{1-\delta}N_\delta$ ($0\leq\delta<1$), and boron arsenide phosphide represented by a compositional formula $B_\alpha P_{1-\delta}As_\delta$.

(3) A compound semiconductor light-emitting diode as described in (1) or (2) above, wherein the difference between the bandgap at room temperature of the current diffusion layer and the bandgap at room temperature of the light-emitting layer accounts for 0.1 eV or more.

(4) A compound semiconductor light-emitting diode as described in any one of (1) to (3) above, wherein the current diffusion layer has a bandgap at room temperature of 2.8 eV to 5.0 eV.

(5) A compound semiconductor light-emitting diode as described in any one of (1) to (4) above, wherein the current diffusion layer has a carrier concentration at room temperature of $1\times 10^{19}$ cm$^{-3}$ or more, a resistivity at room temperature of $5\times 10^{-2}$ Ω·cm or less, and a thickness of 50 nm to 5,000 nm.

(6) A compound semiconductor light-emitting diode as described in any one of (1) to (5) above, wherein the diode includes, between the current diffusion layer and the light-emitting layer, a cladding layer composed of a Group III-V compound semiconductor, and the cladding layer has a bandgap at room temperature wider than that of the light-emitting layer and equal to or narrower than that of the current diffusion layer.

(7) A compound semiconductor light-emitting diode as described in (6) above, wherein the cladding layer is composed of a Group III-V compound semiconductor containing aluminum, gallium, and indium, and the current diffusion layer is composed of a boron-phosphide-based semiconductor containing at least one species selected from among aluminum, gallium, and indium.

(8) A compound semiconductor light-emitting diode as described in (6) or (7) above, wherein the diode includes a composition-graded layer having a compositional gradient and being composed of a boron-phosphide-based semiconductor, and the composition-graded layer serves as the current diffusion layer and the cladding layer.

(9) A compound semiconductor light-emitting diode as described in any one of (1) to (8) above, wherein the light-emitting layer is composed of an aluminum gallium indium phosphide mixed crystal (compositional formula: $Al_X Ga_Y In_Z P$: $0\leq X, Y, Z\leq 1$, $X+Y+Z=1$), and at least one of the current diffusion layer and the cladding layer are composed of an undoped boron-phosphide-based semiconductor to which no impurity element has been intentionally added.

(10) A compound semiconductor light-emitting diode as described in any one of (1) to (9) above, wherein an Ohmic contact electrode is joined to the current diffusion layer or the composition-graded layer.

DESCRIPTION OF REFERENCE NUMERALS

Figure 1:
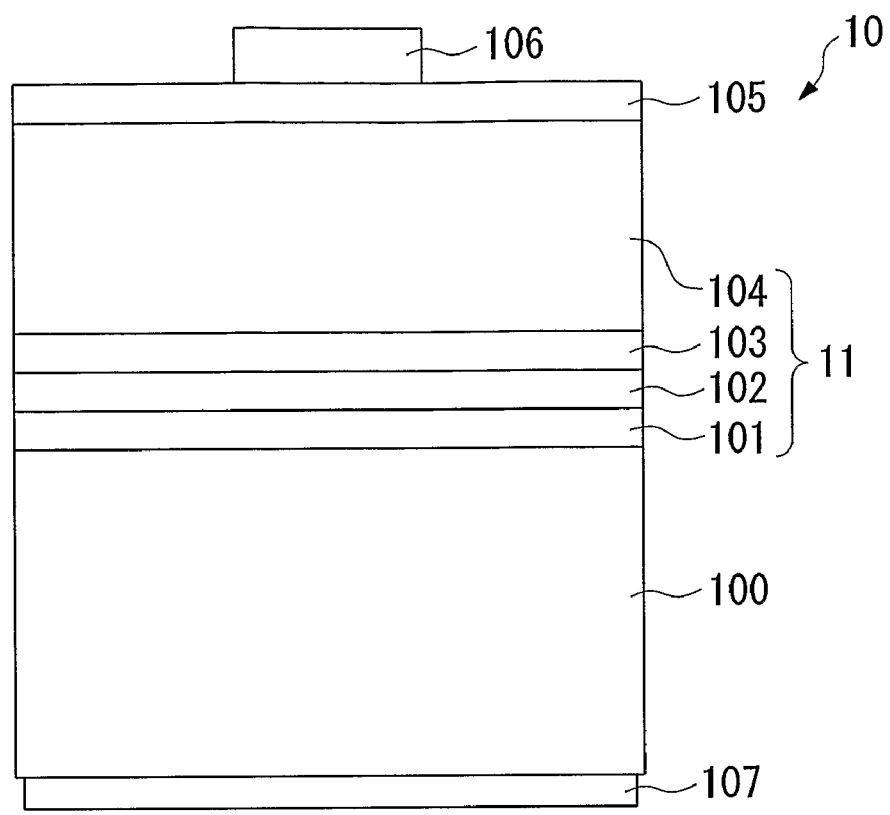
FIG. 1 is a schematic cross-section of an LED of Example 1.

10, 20 LED
11 Stacked structure
100 GaAs substrate
101 p-Type buffer layer
102 p-Type lower cladding layer
103 n-Type light-emitting layer
104 n-Type upper cladding layer
105 Current diffusion layer
106 n-Type Ohmic electrode
107 p-Type Ohmic electrode
108 Composition-graded layer

BEST MODES FOR CARRYING OUT THE INVENTION

The compound semiconductor light-emitting diode of the present invention includes a light-emitting layer composed of a Group III-V compound semiconductor and a current diffusion layer provided on the light-emitting layer.

The current diffusion layer is composed of a boron-phosphide-based semiconductor, which is a type of Group III-V compound semiconductor, and causes forward device operation current for operating the light-emitting diode to diffuse over the light-emitting layer.

The current diffusion layer having a wide bandgap at room temperature and composed of a boron-phosphide-based semiconductor layer and which causes device operation current to diffuse over the cladding layer and the light-emitting layer and effectively serves as a window layer through which emitted light is extracted to the outside.

According to the present invention, the current diffusion layer has a bandgap at room temperature wider than that of the light-emitting layer and is composed of a low-resistance boron-phosphide-based semiconductor. Therefore, device operation current can be diffused over the wide light-emission area. In addition, the current diffusion layer is optically transparent, exhibits excellent Ohmic contact characteristics with respect to the light-emitting layer composed of a Group III-V compound semiconductor layer, and can be readily formed.

Thus, there can be produced a compound semiconductor light-emitting diode which exhibits excellent electric characteristics including forward voltage, which attains uniform emission intensity in a light-emitting area, and which does not absorb emitted light having uniform emission intensity and transmits the light to the outside.

The LED further includes, between the current diffusion layer and the light-emitting layer, a cladding layer composed of a Group III-V compound semiconductor, and the cladding layer has a bandgap at room temperature wider than that of the light-emitting layer and equal to or narrower than that of the current diffusion layer. Thus, the bandgap can be gradually varied from the light-emitting layer to the current diffusion layer in the depth direction of the compound semiconductor light-emitting diode, whereby a compound semiconductor light-emitting diode exhibiting low forward voltage can be provided.

When the current diffusion layer and the cladding layer have a wide bandgap and are formed of a low-resistance conductive boron-phosphide-based semiconductor, a compound semiconductor light-emitting diode which can emit light of almost uniform intensity from virtually the entire area of the light-emitting layer can be provided.

In the case where the light-emitting layer is composed of an aluminum gallium indium phosphide mixed crystal (compositional formula: $Al_XGa_YIn_ZP$: $0 \leq X, Y, Z \leq 1, X+Y+Z=1$), the current diffusion layer is formed from undoped boron phosphide containing phosphorus as a component element. Through employment of the structure, the bandgap of the current diffusion layer increases, thereby reducing electric resistance.

Thus, there can be provided a compound semiconductor light-emitting diode which can cause device operation current to diffuse over virtually the entire surface of the light-emitting layer, and which emits uniform-intensity light of a wavelength of interest from virtually entire area of the light-emitting layer.

As used herein, the term "boron-phosphide-based semiconductor" refers to a Group III-V compound semiconductor having a cubic sphalerite crystal structure and, containing as essential elements, boron (B) and phosphorus (P). Examples include compounds represented by a compositional formula: $B_\alpha Al_\beta Ga_\gamma In_{1-\alpha-\beta-\gamma} P_{1-\delta} As_\delta$ ($0<\alpha \leq 1$, $0 \leq \beta <1$, $0 \leq \gamma <1$, $0<\alpha+\beta+\gamma \leq 1$, $0 \leq \delta <1$); and compounds represented by a compositional formula: $B_\alpha Al_\beta Ga_\gamma In_{1-\alpha-\beta-\gamma} P_{1-\delta} N_\delta$ ($0<\alpha \leq 1$, $0 \leq \beta <1$, $0 \leq \gamma <1$, $0<\alpha+\beta+\gamma \leq 1$, $0 \leq \delta <1$).

Among them, semiconductor compounds containing no element that is susceptible to oxidation (e.g., aluminum (Al)) are particularly preferably employed in the present invention. Examples include boron monophosphide (BP), boron gallium indium phosphide represented by a compositional formula: $B_\alpha Ga_\gamma In_{1-\alpha-\gamma} P$ ($0<\alpha \leq 1$, $0 \leq \gamma <1$), and boron nitride phosphide represented by a compositional formula: $BP_{1-\delta}N_\delta$ ($0 \leq \delta <1$) and boron arsenide phosphide represented by a compositional formula: $B_\alpha P_{1-\delta}As_\delta$, which are mixed crystals containing a plurality of Group V elements.

The current diffusion layer according to the present invention is composed of a conductive boron-phosphide-based semiconductor and has a bandgap at room temperature wider than that of the light-emitting layer.

The difference between the bandgap at room temperature of the current diffusion layer and the bandgap at room temperature of the light-emitting layer is preferably 0.1 eV or more. When the difference is 0.1 eV or more, the formed current diffusion layer sufficiently serves as a window layer.

The bandgap may be determined on the basis of photon energy dependency of absorbance (=h·v) or on the basis of photon energy dependency of a product (=2n·k) of refractive index (n) and extinction coefficient (k).

For example, when the light-emitting layer of a blue-light-emitting compound semiconductor light-emitting diode is composed of a Group III-V compound semiconductor and has a bandgap at room temperature of 2.7 eV, a current diffusion layer composed of a boron-phosphide-based semiconductor and having a bandgap at room temperature of 2.8 eV to 5.0 eV is provided on the light-emitting layer.

Preferably, the current diffusion layer is composed of a boron-phosphide-based semiconductor and has a bandgap at room temperature of 2.8 eV to 5.0 eV. When the above conditions are satisfied, the current diffusion layer can transmit visible light (e.g., red to green light) to the outside, thus serving as a window layer.

When the current diffusion layer composed of a boron-phosphide-based semiconductor has a bandgap in excess of 5.0 eV, the energy gap between the current diffusion layer and the light-emitting layer or the cladding layer excessively increases, which is not preferred for fabricating a compound semiconductor light-emitting diode exhibiting low forward voltage or threshold voltage.

Preferably, the current diffusion layer has a carrier concentration at room temperature of $1 \times 10^{19}$ cm$^{-3}$ or more, a resistivity at room temperature of $5 \times 10^{-2}$ Ω·cm or less, and a thickness of 50 nm to 5,000 nm.

Such a low-resistance boron-phosphide-based semiconductor layer is effectively employed as a current diffusion layer serving also as a window layer through which the light emitted from the light-emitting layer is transmitted to the outside.

The current diffusion layer composed of a boron-phosphide-based semiconductor is formed through a vapor phase growth means such as the halogen method, the halide method, or MOCVD (metal-organic chemical vapor deposition), or molecular-beam epitaxy (see J. Solid State Chem., 133 (1997), p. 269-272).

For example, a current diffusion layer composed of n-type boron monophosphide (BP) may be formed through an atmospheric pressure (near atmospheric pressure) or reduced-pressure MOCVD by use of triethylborane (molecular formula: $(C_2H_5)_3B$) and phosphine (molecular formula: $PH_3$) as sources.

The source supply ratio (V/III ratio; e.g., $PH_3/(C_2H_5)_3B$) during formation of the current diffusion layer composed of n-type boron monophosphide (BP) is preferably 200 or higher, more preferably 400 or higher.

As used herein, the term "V/III ratio" refers to a ratio of atomic concentration of Group V elements including phosphorus to atomic concentration of Group III elements including boron, these sources being supplied to the vapor phase growth zone.

Through precise control of formation rate in addition to formation temperature and V/III ratio, there can be formed a current diffusion layer composed of a boron-phosphide-based semiconductor which absorbs virtually no light emitted from the light-emitting layer and exhibits a wide bandgap.

The n-type BP layer formation temperature is preferably 700° C. to 1,000° C.

Similarly, a current diffusion layer composed of p-type boron monophosphide (BP) may be formed through an atmospheric pressure (near atmospheric pressure) or reduced-pressure MOCVD by use of triethylborane (molecular formula: $(C_2H_5)_3B$) and phosphine (molecular formula: $PH_3$) as sources.

The p-type BP layer formation temperature is preferably 1,000° C. to 1,200° C. The source supply ratio (V/III ratio; e.g., $PH_3/(C_2H_5)_3B$) during layer formation is preferably 10 to 50.

Particularly when the formation rate is controlled to 2 nm/min to 30 nm/min, a current diffusion layer which is composed of boron monophosphide and which exhibits a bandgap at room temperature of 2.8 eV or more can be produced (see Japanese Patent Application No. 2002-158282).

There will next be described another embodiment of the compound semiconductor light-emitting diode in which a cladding layer composed of a Group III-V compound semiconductor is joined to the light-emitting layer composed of a Group III-V compound semiconductor, for the purpose of enhancement in radiation recombination, thereby emitting high-intensity light.

In the above embodiment, the current diffusion layer is provided on the cladding layer. Therefore, the cladding layer is interposed between the light-emitting layer and the current diffusion layer.

The current diffusion layer preferably has a bandgap at room temperature wider than that of the cladding layer. Under the bandgap conditions, light emitted from the light-emitting layer can be transmitted to the outside while light absorption is prevented as effective as possible.

Particularly preferably, the cladding layer has a bandgap at room temperature wider than that of the light-emitting layer and equal to or narrower than that of the current diffusion layer. Under the bandgap conditions, the bandgap decreases from the current diffusion layer toward the light-emitting layer, whereby increase in forward voltage of LEDs and in threshold values of LDs can be prevented.

When the cladding layer is formed of a Group III-V compound semiconductor such as a compound represented by a compositional formula: $Al_XGa_YIn_ZP$ ($0 \leq X, Y, Z \leq 1$, $X+Y+Z=1$) or a similar compound, which contains Al, Ga, and In serving as Group III elements, the current diffusion layer is preferably composed of a boron-phosphide-based semiconductor containing at least one species selected from among Al, Ga, and In.

Under the above conditions, Group III elements (Al, Ga, and In) present on the surface of the cladding layer promote growth of the current diffusion layer containing these elements as component elements during formation of the current diffusion layer on the cladding layer. Thus, the current diffusion layer can readily be formed, and exhibit excellent adhesion with respect to the cladding layer.

Examples of the boron-phosphide-based semiconductor containing at least one species selected from among Al, Ga, and In include the aforementioned boron gallium indium phosphide represented by a compositional formula: $B_\alpha Ga_\gamma In_{1-\alpha-\gamma}P$ ($0<\alpha \leq 1$, $0 \leq \gamma<1$), boron indium phosphide represented by a compositional formula: $B_\alpha In_{1-\alpha}P$ ($0<\alpha<1$), and boron indium arsenide phosphide represented by a compositional formula: $B_\alpha In_{1-\alpha}P_{1-\delta}As_\delta$ ($0<\alpha<1$, $0<\delta<1$).

When a doped Group III-V compound semiconductor to which an impurity element has been intentionally added (e.g., zinc (Zn)-doped $Al_XGa_YIn_ZP$) is provided as a cladding layer, the impurity element (zinc) diffusing from the cladding layer may vary carrier concentration and conduction type of the light emitting layer. In this case, forward voltage (Vf) deviating from the voltage of interest may be applied, or light of a wavelength deviating from the wavelength of interest may be emitted.

In contrast, an undoped (i.e., n-type or p-type) boron-phosphide-based semiconductor exhibits low electric resistance in an undoped state.

Therefore, the cladding layer is preferably formed of an undoped boron-phosphide-based semiconductor. Since the cladding layer has a low impurity element amount, the amount of impurity element diffusing into the light-emitting layer can be reduced, whereby deterioration in characteristics of the light-emitting layer which would otherwise be caused by diffusion of external impurity elements can be prevented. In addition, diffusion of device operation current over the light-emitting layer can be facilitated by virtue of low resistance.

Meanwhile, in the case where an undoped boron-phosphide-based semiconductor to which no impurity element has been intentionally added is provided as a current diffusion layer, the same effect as attained by the cladding layer can also be attained.

The cladding layer or the current diffusion layer composed of an undoped boron-phosphide-based semiconductor has a wide bandgap. Thus, when the light-emitting layer is composed of gallium indium nitride represented by a compositional formula: $Ga_XIn_{1-X}N$ ($0 \leq X \leq 1$) or gallium nitride phosphide represented by a compositional formula: $GaN_{1-Y}P_Y$ ($0 \leq Y \leq 1$), an undoped boron monophosphide layer can be employed as an n-type or a p-type cladding layer.

Particularly when the light-emitting layer is composed of a compound semiconductor material containing phosphorus (P) as a component element (e.g., compositional formula: $Al_XGa_YIn_ZP$ ($0 \leq X, Y, Z \leq 1$, $X+Y+Z=1$), an undoped boron monophosphide layer is more preferably employed as a cladding layer.

When the light-emitting layer contains a large amount of phosphorus as a component element, the difference in phosphorus atom concentration between the light-emitting layer and the boron-phosphide-based semiconductor layer serving as a current diffusion layer or a cladding layer decreases. Thus, diffusion of P atoms from the current diffusion layer or the cladding layer to the light-emitting layer is suppressed, whereby deterioration of the light-emitting layer can be prevented.

In a compound semiconductor light-emitting diode in which a cladding layer is joined to a light-emitting layer, a composition-graded layer having a compositional gradient and being composed of a boron-phosphide-based semiconductor is preferably provided so as to serve as a current diffusion layer and a cladding layer.

In the composition-graded layer, a compositional gradient is provided such that the bandgap increases in the thickness increase direction (i.e., from the light-emitting layer to the top of the current diffusion layer).

For example, in the case where the composition-graded layer is composed of boron gallium phosphide ($B_{1-X}Ga_XP$: $0 \leq X \leq 1$), a compositional gradient is provided such that the boron (B) compositional ratio (=1-X) increases and the gallium (Ga) compositional ratio (=X) decreases, in the thickness increase direction. Specifically, the compositional gradient is provided such that the portion of the composition-graded layer which is in contact with the light-emitting layer is formed of gallium phosphide (GaP) having a boron compositional ratio (=1−X) of 0. As the layer thickness increases from the cladding layer toward the current diffusion layer, the boron compositional ratio increases. The top portion of the current diffusion layer is formed of BP having a boron compositional ratio of 1.

The thus-provided composition-graded boron-phosphide-based semiconductor layer having a compositional gradient can elevate the bandgap at room temperature of gallium phosphide from 2.2 eV to, for example, 2.8 eV or more, and serve as a current diffusion layer and a cladding layer.

Through provision of the boron-phosphide-based semiconductor layer (composition-graded layer) having a compositional gradient such that the bandgap gradually decreases from the current diffusion layer toward the light-emitting layer, increase in forward voltage of LEDs and in threshold values of LDs can be prevented.

When the composition-graded layer serving as the current diffusion layer and as the cladding layer is formed, a compositional gradient is provided such that the bandgap is changed with a linear, step-by-step, or curve-like change profile.

A portion of the composition-graded layer serving as a cladding layer is provided with a compositional gradient such that the bandgap gradually increases in the thickness increase direction.

On the current diffusion layer or the composition-graded layer, an n-type or a p-type Ohmic electrode is provided. In the case where the current diffusion layer or the composition-graded layer is composed of an n-type boron-phosphide-based semiconductor, the Ohmic electrode may be formed from a gold (Au) alloy such as gold (Au)-germanium (Ge).

In the case where the current diffusion layer or the composition-graded layer is composed of a p-type boron-phosphide-based semiconductor, the Ohmic electrode may be formed from conventionally employed nickel (Ni), nickel alloy, gold (Au)-zinc (Zn) alloy, gold (Au)-beryllium (Be) alloy, or the like.

When the Ohmic electrode has a multi-layer structure, the uppermost layer is preferably formed of gold (Au) or aluminum (Al) in order to facilitate bonding. In the case where the Ohmic electrode has a tri-layer structure, an intermediate layer provided between the bottom portion and the uppermost layer may be formed of a transition metal (e.g., titanium (Ti), molybdenum (Mo) or platinum (Pt)).

Through employment of the current diffusion layer or the composition-graded layer composed of a boron-phosphide-based semiconductor, an electrode exhibiting excellent Ohmic contact can be formed on the current diffusion layer or the composition-graded layer, even when the current diffusion layer or the composition-graded layer has a bandgap wider than that of another layer such as a cladding layer.

The reason why such an excellent Ohmic electrode can be formed is as follows. As compared with a conventional current diffusion layer composed of $Al_XGa_YAs$ or $Al_XGa_YIn_ZP$, the current diffusion layer or the composition-graded layer composed of a boron-phosphide-based semiconductor exhibits smaller ionic bond property. Therefore, even though the bandgap is wide, there can be obtained a conductive layer exhibiting remarkably low resistance, as compared with a conventional semiconductor material. Among boron-phosphide-base semiconductors, boron monophosphide (BP) in an undoped state can readily provide a conductive layer having a high carrier concentration of $10^{19}$ cm$^{-3}$ to $10^{20}$ cm$^{-3}$. Thus, the current diffusion layer or the composition-graded layer composed of a boron-phosphide-based semiconductor exhibits excellent permeability to emitted light extracted to the outside by virtue of wide bandgap. On the current diffusion layer or the composition-graded layer, a low-contact-resistance Ohmic electrode can be formed.

EXAMPLES

Example 1

The present invention will next be described in detail with reference to an exemplary boron phosphide LED having a current diffusion layer composed of a boron monophosphide semiconductor.

FIG. 1 is a schematic cross-sectional view of a boron phosphide LED 10 of Example 1 having a double-hetero (DH) junction structure and a stacked structure 11 thereof. Since FIG. 1 is a schematic view, dimensions (e.g., thickness proportions) of the component layers may be different from the actual values.

The stacked structure 11 was formed through sequentially stacking on a zinc (Zn)-doped p-type (100)-gallium arsenide (GaAs) single-crystal substrate 100 the following layers: a zinc-doped p-type GaAs buffer layer 101, a lower cladding layer 102 composed of a zinc-doped aluminum gallium indium phosphide mixed crystal ($(Al_{0.70}Ga_{0.30})_{0.50}In_{0.50}P$), an undoped n-type light-emitting layer 103 composed of $(Al_{0.14}Ga_{0.86})_{0.50}In_{0.50}P$, and a selenium (Se)-doped n-type upper cladding layer 104 composed of $(Al_{0.70}Ga_{0.30})_{0.50}In_{0.50}P$ (see J. Korean Association of Crystal Growth, 11(5) (2001), p. 207-210).

The layers 101 to 104 were vapor-phase-grown on the substrate 100 through a conventional reduced-pressure MOCVD means.

On the upper cladding layer 104 composed of $(Al_{0.70}Ga_{0.30})_{0.50}In_{0.50}P$, an undoped n-type boron indium phosphide ($B_{0.40}In_{0.60}P$) was deposited, to thereby form a current diffusion layer 105.

The current diffusion layer 105 composed of the n-type boron indium phosphide was formed through an atmospheric pressure (near atmospheric pressure) metal-organic vapor phase epitaxy (MOVPE) by use of triethylborane (molecular formula: $(C_2H_5)_3B$) as a boron (B) source, trimethylindium (molecular formula: $(CH_3)_3In$) as an indium source, and phosphine (molecular formula: $PH_3$) as a phosphorus source.

The current diffusion layer 105 was formed under the same conditions as employed during formation of boron monophosphide (BP) having a bandgap at room temperature of about 4.3 eV; i.e., a V/III ratio of 800, growth temperature of 700° C., and growth rate of 30 nm/min.

The boron (B) compositional ratio of the n-type boron indium phosphide forming the current diffusion layer 105 was controlled to 0.40 so as not to lattice-match GaAs but to attain a wide bandgap. The current diffusion layer 105 composed of the n-type boron indium phosphide had a thickness of 700 nm.

The thus-formed current diffusion layer 105 was found to be composed of undoped n-type $B_{0.40}In_{0.60}P$ and have a bandgap at room temperature of 2.5 eV.

The carrier concentration and the resistivity at room temperature were found to be $1\times10^{20}$ cm$^{-3}$ and $2\times10^{-2}$ $\Omega\cdot$cm.

On the entire surface of the current diffusion layer 105, a gold-germanium (Au/Ge) alloy film, a nickel (Ni) film, and a gold (Au) film were sequentially deposited through conventional vacuum vapor deposition and electron-beam vapor deposition.

Subsequently, the metal films were selectively patterned through a known photolithographic technique such that the aforementioned tri-layer electrode having a bottom surface formed of the Au—Ge alloy film remained exclusively in the portion where a n-type Ohmic electrode 106 also serving as a pad electrode for wire bonding was to be provided.

Other than the area where the n-type Ohmic electrode 106 was provided, the metal films (including Au—Ge alloy film) were removed through etching so as to expose the surface of the n-type boron indium phosphide layer serving as the current diffusion layer 105.

After removal of photoresist material, the n-type boron indium phosphide layer was selectively patterned again so as to provide lattice-pattern grooves for cutting the structure into light-emitting devices (chips). The grooves had a line width of 50 μm and were provided in the same direction as the <110> crystal orientation of the substrate 100.

Thereafter, the thus-formed lattice-pattern of the n-type boron indium phosphide layer was selectively removed through plasma dry etching employing a chlorine-containing halogen mixture gas.

On the entire backside surface of the p-type GaAs single-crystal substrate 100, a gold-beryllium (Au—Be) film was deposited through conventional vacuum vapor deposition, thereby forming a p-type Ohmic electrode 107.

The GaAs substrate 100 was cleaved along the aforementioned slip-like grooves, which had a line width of 50 μm and were provided in the same direction as the <110> crystal orientation of the substrate 100, to thereby produce square (350 μm×350 μm) LED chips 10.

Emission characteristics of the LED chips 10 were evaluated when forward device operation current (20 mA) was caused to flow between the n-type Ohmic electrode 106 and the p-type Ohmic electrode 107. The LED chips 10 were found to emit red (slightly orange) light having an emission center wavelength of 610 nm.

Light emission was visually observed in virtually the entire surface of the light-emitting layer 103 other than the projection area of the n-type Ohmic electrode 106. A near field pattern of the emitted light indicated that the light emitted from the light-emitting layer 103 other than the above projection area had virtually uniform intensity. The luminance of the light emitted from each chip before resin-molding, as determined through a typical integrating sphere, was 40 mcd.

Since the current diffusion layer 105 had a wide bandgap and was composed of low-resistance n-type boron indium phosphide, the current diffusion layer 105 also served as a window layer through which the light emitted from the light-emitting layer 103 is transmitted to the outside.

Since the n-type Ohmic electrode 106 was provided on the current diffusion layer 105 composed of low-resistance n-type boron indium phosphide, forward voltage (Vf) could be lowered to 2.3 V. When a reverse current of 10 μA was applied, the reverse voltage exceeded 8 V.

Example 2

The present invention will next be described in detail with reference to an exemplary boron phosphide semiconductor LED having a boron-phosphide-based semiconductor layer (composition-graded layer) having a boron compositional gradient, the layer serving as both a current diffusion layer and a cladding layer.

Figure 2:
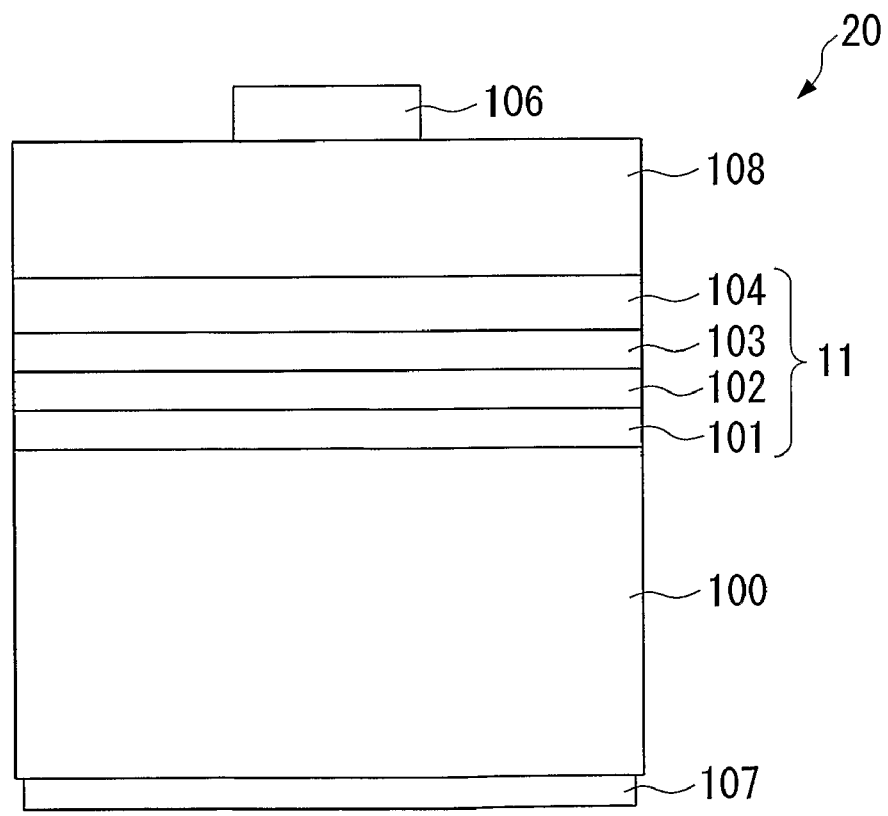
FIG. 2 is a schematic cross-section of an LED of Example 2.

FIG. 2 is a schematic cross-sectional view of a boron phosphide LED 20 of Example 2. Similar to FIG. 1, since FIG. 2 is a schematic view, dimensions (e.g., thickness proportions) of the component layers may be different from the actual values.

The same members as employed in the boron phosphide LED 10 shown in FIG. 1 are denoted by the same reference numerals, and detailed description therefor is omitted.

In Example 2, a selenium (Se)-doped n-type upper cladding layer 104 employed in the boron phosphide LED 10 of Example 1 and composed of $(Al_{0.70}Ga_{0.30})_{0.50}In_{0.50}P$ was provided as a thin-film cladding layer (hereinafter the layer is also denoted by the same numeral 104). On the thin-film cladding layer, a composition-graded layer 108 composed of an undoped boron gallium phosphide mixed crystal ($B_\alpha Ga_{1-\alpha}P$: 0<α<1) was formed.

The thin-film cladding layer 104 composed of a selenium (Se)-doped n-type $(Al_{0.70}Ga_{0.30})_{0.50}In_{0.50}P$ was formed through the same procedure as employed for forming the upper cladding layer 104 (thickness: 5 μm) in Example 1, except that the thickness of the layer was adjusted to 75 nm.

The composition-graded layer 108 composed of $B_\alpha Ga_{1-\alpha}P$ (0<α<1) was formed through reduced-pressure MOCVD by use of $(C_2H_5)_3B/(CH_3)_3Ga/PH_3$ system at 750° C. The thickness was adjusted to 740 nm. The boron (B) compositional ratio (a) of the composition-graded layer 108 was adjusted to 0.05 at the junction interface between the layer and the thin-film cladding layer 104. The boron compositional ratio was provided with linear compositional gradient by reducing the supply of $(CH_3)_3Ga$ and maintaining the supply of $(C_2H_5)_3B$ to the vapor phase growth system at a consistent rate as time elapsed and as increase in film thickness. Specifically, the composition-graded layer was formed such that the boron (B) compositional ratio (a) of the upper surface became 1.0 (i.e., formation of boron phosphide (BP)).

The surface portion of the composition-graded layer 108 composed of $B_\alpha Ga_{1-\alpha}P$ was found to have a carrier concentration of $8\times10^{18}$ cm$^{-3}$ and a resistivity of $6\times10^{-2}$ Ω·cm.

The refractive index and extinction coefficient of the composition-graded layer 108 were determined by use of a conventional ellipsometer, and the average bandgap of the composition-graded layer 108, as calculated from the determined refractive index and extinction coefficient, was about 3.1 eV. In particular, the surface portion (from the surface to the depth of about 100 nm) was found to have a bandgap at room temperature of about 4.0 eV. Accordingly, the composition-graded layer 108 can be employed as a cladding layer serving as a window layer and as a current diffusion layer.

The phosphorus (P) concentration profile of the composition-graded layer 108 in the depth direction was determined through a conventional SIMS means. No significant diffusion of a large amount of phosphorus (P) contained in the composition-graded layer 108 through the thin-film cladding layer 104 to the light-emitting layer 103 was observed.

In a manner similar to that of Example 1, an n-type Ohmic electrode 106 having a circular plan view (diameter: about 130 μm) was provided on the center of the composition-graded layer 108. Similar to Example 1, a p-type Ohmic electrode 107 composed of an Au—Be alloy was formed on the entire backside surface of the GaAs substrate 100. The Au—Be alloy film forming the p-type Ohmic electrode 107 had a thickness of about 2 μm.

After formation of the n-type Ohmic electrode 106, lattice-like cutting lines were provided on the (100)-GaAs single-crystal substrate 100 in the same direction as the [1.−1.0] and [−1.−1.0] crystal orientations of the substrate 100, and the substrate was cut along the cutting lines, to thereby produce LED chips 20 having a square plan view (400 μm×400 μm).

The LED chips 20 were evaluated when forward current (20 mA) was caused to flow between the n-type Ohmic electrode 106 and the p-type Ohmic electrode 107. The LED chips 20 were found to emit red-orange light having an emission center wavelength of 610 nm, which was desired. The observed near field pattern of the emitted light indicated that the light emitted from the area other than the n-type Ohmic electrode 106 provided at the center of each chip 20 had virtually uniform intensity.

The above results indicate that, according to the present invention, diffusion of device operation current can be attained uniformly over a wide area of the light-emitting layer 103 without intentionally providing a plurality of small Ohmic electrodes on the surface of a cladding layer, which has been employed for attaining diffusion of device operation current over the light-emitting plane in the conventional techniques. The luminance of the light emitted, as determined through a typical integrating sphere, was about 44 mcd.

In the composition-graded layer 108 serving as a current diffusion layer and as a window layer, the bandgap was gradually reduced from the current diffusion layer surface toward the light-emitting layer 103. Therefore, the forward voltage at a forward current of 20 mA was lowered to 2.3 V, and the reverse voltage at a reverse current of 10 μA was found to be 8 V.

INDUSTRIAL APPLICABILITY

The LED of the present invention can be used as compound semiconductor LEDs having a Group III-V compound semiconductor light-emitting layer of various emission wavelengths. Particularly, the LED of the present invention, attaining high luminance, can be used as an LED for display devices, an LED for electronic apparatuses such as optical communication apparatuses.

The invention claimed is:

1. A compound semiconductor light-emitting diode comprising a light-emitting layer composed of a Group III-V compound semiconductor, and a current diffusion layer provided on the light-emitting layer and composed of a Group III-V compound semiconductor, characterized in that the current diffusion layer is composed of a conductive boron-phosphide-based semiconductor and has a bandgap at room temperature wider than that of the light-emitting layer,
wherein the diode includes, in a thickness direction between the current diffusion layer and the light-emitting layer, a cladding layer composed of a Group III-V compound semiconductor, and the cladding layer has a bandgap at room temperature wider than that of the light-emitting layer and equal to or narrower than that of the current diffusion layer,
wherein the current diffusion layer is composed of a boron-phosphide-based semiconductor having a boron compositional gradient such that the bandgap increases from the bottom surface of the current diffusion layer closest to the light-emitting layer to a top surface of the current diffusion layer,
wherein the cladding layer is composed of a Group III-V compound semiconductor containing aluminum, gallium, and indium, and the current diffusion layer is composed of a boron-phosphide based semiconductor containing at least one species selected from among aluminum, gallium and indium, and
wherein an Ohmic contact electrode is joined to the current diffusion layer.

2. A compound semiconductor light-emitting diode according to claim 1, wherein the current diffusion layer is composed of at least one species selected from among
boron monophosphide,
boron gallium indium phosphide represented by a compositional formula $B_\alpha Ga_\gamma In_{1-\alpha-\gamma}P$ ($0<\alpha\leq 1$, $0\leq\gamma<1$),
boron nitride phosphide represented by a compositional formula $BP_{1-\delta}N_\delta$ ($0\leq\delta<1$), and
boron arsenide phosphide represented by a compositional formula $B_\alpha P_{1-\alpha}As_\delta$.

3. A compound semiconductor light-emitting diode according to claim 1, wherein the difference between the bandgap at room temperature of the current diffusion layer and the bandgap at room temperature of the light-emitting layer is 0.1 eV or more.

4. A compound semiconductor light-emitting diode according to claim 1, wherein the current diffusion layer has a bandgap at room temperature of 2.8 eV to 5.0 eV.

5. A compound semiconductor light-emitting diode according to claim 1, wherein the current diffusion layer has a carrier concentration at room temperature of $1\times 10^{19}$ cm$^{-3}$ or more, a resistivity at room temperature of $5\times 10^{-2}$ Ω·cm or less, and a thickness of 50 nm to 5,000 nm.

6. A compound semiconductor light-emitting diode according to claim 1, wherein the light-emitting layer is composed of an aluminum gallium indium phosphide mixed crystal represented by a compositional formula $Al_X Ga_Y In_Z P$ ($0\leq X, Y, Z\leq 1$, $X+Y+Z=1$), and the current diffusion layer is composed of an undoped boron-phosphide-based semiconductor to which no impurity element has been intentionally added.

7. A compound semiconductor light-emitting diode according to claim 1, wherein the current diffusing layer has a bandgap which increases 0.6 eV or more in the thickness direction from the bottom surface of the current diffusion layer to the top of the current diffusion layer.

* * * * *